United States Patent [19]
Shibata et al.

[11] Patent Number: 6,115,725
[45] Date of Patent: Sep. 5, 2000

[54] SEMICONDUCTOR ARITHMETIC APPARATUS

[75] Inventors: Tadashi Shibata, 5-2, Nihondaira, Taihaku-ku, Sendai-shi, Miyagi-ken 982-02; Tadahiro Ohmi, 1-17-301, Komegabukuro 2-chome Aoba-ku, Sendai-shi, Miyagi-ken 980; Akira Nataka, Miyagi-ken; Tatsuo Morimoto, Miyagi-ken; Masahiro Konda, Miyagi-ken, all of Japan

[73] Assignees: Tadashi Shibata; Tadahiro Ohmi, both of Miyagi-ken, Japan

[21] Appl. No.: 09/014,644

[22] Filed: Jan. 28, 1998

[30] Foreign Application Priority Data

Feb. 3, 1997 [JP] Japan ................ 9-020522

[51] Int. Cl.$^7$ .................. G06F 7/00; H04N 7/12
[52] U.S. Cl. ............. 708/203; 708/207; 348/422
[58] Field of Search ............ 708/203, 201, 708/207, 422, 424; 348/422; 382/236, 251

[56] References Cited

U.S. PATENT DOCUMENTS

| | | | |
|---|---|---|---|
| 5,031,037 | 7/1991 | Israelsen | 348/422 |
| 5,187,675 | 2/1993 | Dent et al. | 708/207 |

FOREIGN PATENT DOCUMENTS

| | | | |
|---|---|---|---|
| 60-68654 | 4/1985 | Japan | H01L 29/78 |
| WO 90/13912 | 11/1990 | Japan | H01L 21/316 |
| 3-6679 | 1/1991 | Japan | G06G 7/60 |
| WO 92/16971 | 10/1992 | Japan | H01L 29/788 |
| 5-335506 | 12/1993 | Japan | H01L 27/10 |
| 5-335656 | 12/1993 | Japan | H01L 49/00 |
| WO 93/24958 | 12/1993 | Japan | H01L 27/10 |
| 6-53431 | 2/1994 | Japan | H01L 27/10 |
| 6-77427 | 3/1994 | Japan | H01L 27/10 |
| 6-112427 | 4/1994 | Japan | H01L 27/10 |
| 6-139380 | 5/1994 | Japan | G06G 7/60 |
| 6-244375 | 9/1994 | Japan | H01L 27/10 |
| 6-250994 | 9/1994 | Japan | G06F 15/18 |
| 6-252744 | 9/1994 | Japan | H03K 19/21 |
| 07153924 | 6/1995 | Japan | H01L 27/10 |
| 07161942 | 6/1995 | Japan | H01L 27/10 |
| WO 95/20268 | 7/1995 | Japan | H03K 19/094 |
| 07200513 | 8/1995 | Japan | G06F 15/18 |
| 07211084 | 8/1995 | Japan | G11C 11/56 |
| 07226085 | 8/1995 | Japan | G11C 11/56 |
| 07226912 | 8/1995 | Japan | H04N 5/907 |
| WO 95/22145 | 8/1995 | Japan | G11C 11/56 |
| 08084062 | 3/1996 | Japan | H03K 19/0175 |
| 08195091 | 7/1996 | Japan | G11C 16/06 |
| 08221504 | 8/1996 | Japan | G06G 7/60 |
| 08274197 | 10/1996 | Japan | H01L 21/8247 |
| WO 96/30853 | 10/1996 | Japan | G06G 7/12 |
| WO 96/30854 | 10/1996 | Japan | G06G 7/12 |
| WO 96/30855 | 10/1996 | Japan | G06G 7/60 |
| WO 96/30948 | 10/1996 | Japan | H01L 29/788 |
| 09244875 | 9/1997 | Japan | G06F 7/50 |
| 09245110 | 9/1997 | Japan | G06G 7/60 |

*Primary Examiner*—Chuong Dinh Ngo
*Attorney, Agent, or Firm*—Randall J. Knuth

[57] ABSTRACT

The real time compression of moving images employing vector quantization is realized using simple hardware and with an optimal compression ratio with respect to the communication line capacity employed. In the operating system, which is provided with a first mechanism (202), comprising a plurality of groups of numerical values, a second mechanism (201), a first circuit (206), a second circuit (206), and a third circuit (210), the second circuit comprises a plurality of fourth circuits divided into two or more groups (210–213, 219, and 301), the fourth circuits have a plurality of input terminals and at least one output terminal, and a mechanism is provided having a structure wherein various signals expressing degrees of similarity are inputted into the plurality of input terminals, only that signal having the largest degree of similarity among the variety of signals expressing degrees of similarity which are inputted is outputted from the output terminal, and the output signal of a predetermined first group among the two or more groups is inputted into an input terminal of a second group, whereby only one first vector having the largest degree of similarity is selected.

28 Claims, 13 Drawing Sheets

| Characteristics | |
|---|---|
| Manufacturing Technology | 0.6 μm CMOS/3 - Layer Metal |
| Power Source Voltage | 3.3V |
| Power Consumed | 0.58W @ 33MHz |
| Number Of Transistors | Approximately 800,000 |
| Chip Surface Area | 7.98mm x 9.03mm |
| Code Vectors | 32KSRAM (256) |

Fig. 9

SEMICONDUCTOR ARITHMETIC APPARATUS

BACKGROUND OF THE INVENTION AND DESCRIPTION OF RELATED ART

1. Field of the Invention

The present invention relates to a semiconductor arithmetic apparatus, and in particular, relates to a system which is capable of executing calculations such as image processing and the like at high speed.

2. Description of the Related Art

In concert with the development of informational equipment and the rapid spread of information networks such as the LAN and WAN which comprise the Internet in recent years, it has become possible to gain access to home pages installed in computers around the world and to display various types of image data on home terminals, and thus to easily acquire desired information. However, it is presently the case that almost all these images are static images, and in order to display moving image data, it is necessary to download such data over a longer period of time than that required for display of the images. This is because moving image data involves an amount of data which is very large with respect to the transmission capacity of the information network. For example, for a moving color image with a resolution of 640×480, if 30 frames a second are required for display, the data must be transmitted at approximately 220 Mbps. However, networks having such a large transmission capacity are not common. Accordingly, in order to transmit moving image data involving a large amount of data to a distant place, techniques are necessary for conducting data compression in real time in accordance with the transmission capacity of the communication circuits.

One method of data compression is termed vector quantization. In vector quantization, a freely selected vector having a certain number of dimensions is compared with a number of differing vectors having the same number of dimensions which were prepared in advance (a code book), and the most similar vector is selected from among these, and the original vector is quantized in accordance with the pattern number thereof. If the number of vectors within the code book (the code vectors) is smaller than the number of possible cases of the original vector, the data are compressed. During expansion, it is then only necessary to retrieve the vector corresponding to the number from the code book. For this reason, vector quantization has been widely known as a data compression algorithm which greatly simplifies expansion.

However, since the most similar vector must be selected from among a large a number of code book vectors, it is necessary to conduct an extremely large number of calculations during compression, and this causes a problem in that the processing takes a long period of time. In the vector quantization which is commonly employed in image data compression, a 4×4 pixel block is extracted from the two dimensional array of the image, and this is employed as a 16-dimension vector. If this vector is, for example, quantized using a CISC processor and 2,048 code book vectors, approximately 1,200,000 operations are required. Even if these operations are carried out using a 166 MHz Pentium processor (made by Intel), this is an enormous amount of calculation which will require approximately 20 seconds.

In order to solve this problem, a dedicated processor was developed which executes operations in parallel. Correlators which conduct a comparison between quantized vectors and code vectors and express the degree of similarity therebetween as numerical values are commonly disposed in parallel in such dedicated processors; the degree of similarity with respect to all code vectors is thus simultaneously calculated in a parallel manner. The distance between vectors is commonly employed in the calculation of the degree of similarity; the vector having the smallest distance is thus judged to have the largest degree of similarity. Accordingly, by providing a circuit which simultaneously accepts the distance data from the correlators in a parallel manner and finds the minimum value thereof, it is possible to carry out vector quantization at high speed.

However, in the structure of such minimum value detecting circuits, there is a problem in that once the processor has been produced, the number of code vectors is limited by the number of correlator blocks provided within the processor, and this is, at a maximum, on the level of 256. In particular, this is a factor hindering attempts to take advantage of the fact that as the number of code vectors increases, the quality of the image resulting after vector quantization has been carried out and compression and expansion have been performed is improved, and to appropriately select the number of code vectors in correspondence with the capacity of various communication lines. Furthermore, when the distance data from all code vectors are inputted in a batch manner and the minimum value is calculated, there is a problem in that as a result of the wiring delay within the processor, timing lags are likely to occur in the distance data outputted from each correlator, and the design thus becomes difficult.

SUMMARY OF THE INVENTION

The present invention was created in order to solve the problems described above; it is an object thereof to provide a semiconductor arithmetic circuit which realizes an optimal compression ratio in the real time compression of moving images using vector quantization, with respect to the communication line capacity employed and using simple hardware.

The present invention comprises an operating system which is provided with: a mechanism for storing a plurality of first vectors comprising a plurality of groups of numerical values, to which predetermined identification codes are allotted; a mechanism for accepting from the exterior second vectors comprising a plurality of groups of numerical values; a first circuit for conducting a comparison between the first vectors and the second vectors and quantizing the degree of similarity therebetween; a second circuit for selecting the first vector having the largest degree of similarity; and a third circuit for specifying the identification code allotted to the first vector selected;

wherein the structure is such that the second circuit comprises a plurality of fourth circuits divided into two or more groups, the fourth circuits have a plurality of input terminals and at least one output terminal, signals expressing the degree of similarity are inputted into the plurality of input terminals, only that signal having the highest degree of similarity among the signals expressing the degree of similarity inputted into the input terminals is outputted from the output terminal, and the output signals of a predetermined first group among the two or more groups are inputted into the input terminals of the second group; whereby a means is provided for selecting only one first vector having the greatest degree of similarity.

By means of the present invention, since it is possible to execute the selection of the code vector having the largest degree of similarity by block unit within a plurality of blocks, it is possible to change the upper limit of the number of vectors handled in a block unit or a chip unit using hardware, and by electrically controlling the operation of the blocks within the hardware having such a structure, it is possible to freely change the number of code vectors. Furthermore, since it is possible to divide all the code vectors by block using a comparatively small number of code vectors, it is possible to ameliorate the timing lags in the distance data resulting from wiring delays, and the design is thus facilitated. Furthermore, the vector quantization operation of the present invention is executed in parallel with respect to all code vectors, so that it is possible to conduct vector quantization at a speed higher than that conventionally possible. As a result of the above effects, it is possible to realize a compression ratio with respect to the real time compression of moving images using vector quantization which is optimal with respect to the communication line capacity.

By means of the present invention, it is possible to easily alter the number of code vectors in the vector quantization both in terms of hardware and electrically, and the timing design of the circuit blocks is also facilitated. Furthermore, since high speed parallel operations are executed, it is possible to conduct the real time compression of moving images using vector quantization with a compression ratio which is optimal with respect to the communication line capacity.

BRIEF DESCRIPTION OF THE DRAWINGS

FIG. 9 shows the features of a chip produced in accordance with the first embodiment.

| | |
|---|---|
| 101–108 | VQ chips, |
| 109 | input vector input terminal, |
| 110 | quantization number output terminal, |
| 111–118 | chip-external wiring used for minimum value signal transmission within the chip, |
| 119 | chip-external wiring used for chip number transmission, |
| 120 | chip external wiring used for vector number transmission, |
| 201 | FIFO buffer used for input vector temporary storage, |
| 202–205 | SRAM used for storage of 64 code vectors, |
| 206–209 | difference absolute value circuits, |
| 210–213 | first stage minimum value detection circuits, |
| 214–217 | first stage number specifying circuits, |
| 218 | second stage minimum value detection circuit, |
| 219 | second stage number specifying circuit, |
| 301 | third stage minimum value detection circuit, |
| 302 | third stage number specifying circuit, |
| 303 | FIFO buffer used for temporary storage of quantization numbers, |
| 401 | 8 bit adder, |
| 402 | absolute value circuit, |
| 403 | 12 bit addition accumulator, |
| 404 | 12 bit parallel signal series conversion circuit, |
| 501 | register, |
| 502 | difference absolute value distance signal, |
| 503 | logic gate having a function such that when the output from 501 has a value of 1, the inputted distance signal is outputted in an unchanged manner, while a value of 1 is outputted when the output from register 501 has a value of 0, |
| 504 | AND gate, |
| 505 | logic gate having a function such that a value of 1 is outputted only when |
| the | outputs of logic gate 503 and AND gate 504 are equal, |
| 601–60B | minimum value position signal input terminals, |
| 609–614 | OR gates, |
| 615–621, 701–703 | OR gates, |
| 1001 | NOR gate, |
| 1002 | AND gate, |
| 1101–1104 | minimum value detecting circuits, |
| 1105–1108 | OR gates, |
| 1109 | minimum value detecting circuit, |
| 1201 | arithmetic operation circuit, |
| 1202, 1203 | registers. |

BEST MODE FOR CARRYING OUT THE INVENTION

Hereinbelow, the present invention will be explained in detail using embodiments; however, it is of course the case that the present invention is in no way limited to the embodiments described.

(Embodiment 1)

Figure 1:
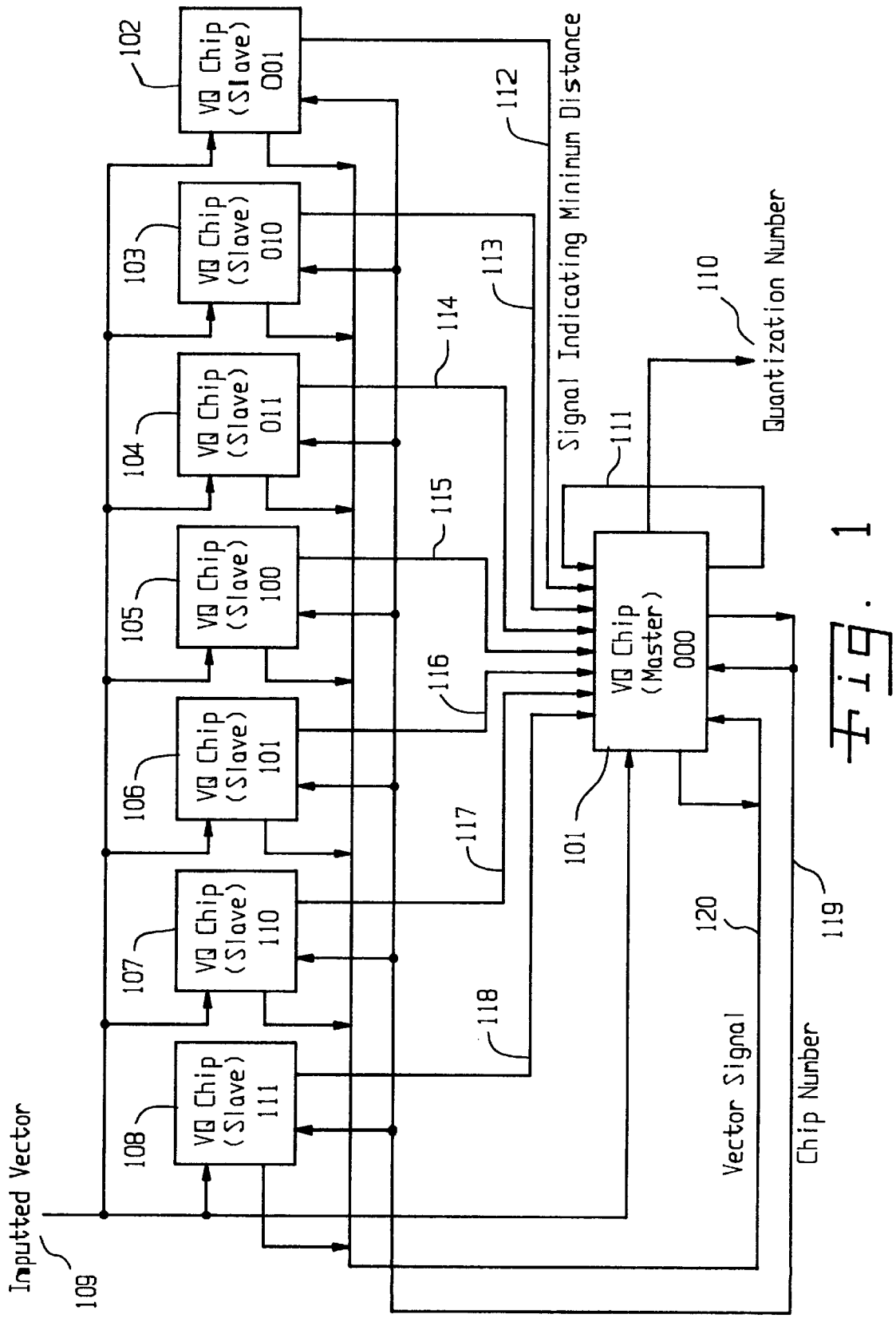
FIG. 1 is a structural diagram of a system which conducts vector quantization.

FIG. 1 shows a first embodiment of the present invention, in which an operating system which conducts the vector quantization of vectors having 8 bits and 16 elements using a maximum of 2048 code vectors by means of a structure having three stages of minimum value detecting circuits, is constructed using eight vector quantization processor chips. In the present embodiment, 8 bit 16 element vectors are used; however, the present invention is also applicable to 4 bit 8 element vectors, or other freely selected numbers of bits and elements. Furthermore, the number of code vectors may be greater or less than 2,048, and it is of course the case that the number of chips may be greater than or less than 8.

References 101 to 108 indicate vector quantization processors (hereinbelow referred to as VQ chips) which store, respectively, 256 code vectors. The quantized vectors (hereinbelow referred to as the input vectors) are inputted in a parallel manner from the terminal 109 into each VQ chip (101 through 106) by 32 bits, and the quantization number is outputted from terminal 110. Here, the internal circuitry of VQ chips 101 through 108 is completely identical; however, for the purposes of convenience, VQ chip 101 will be referred to as the master chip, while VQ chips 102 through 108 will be referred to as slave chips.

Figure 2:
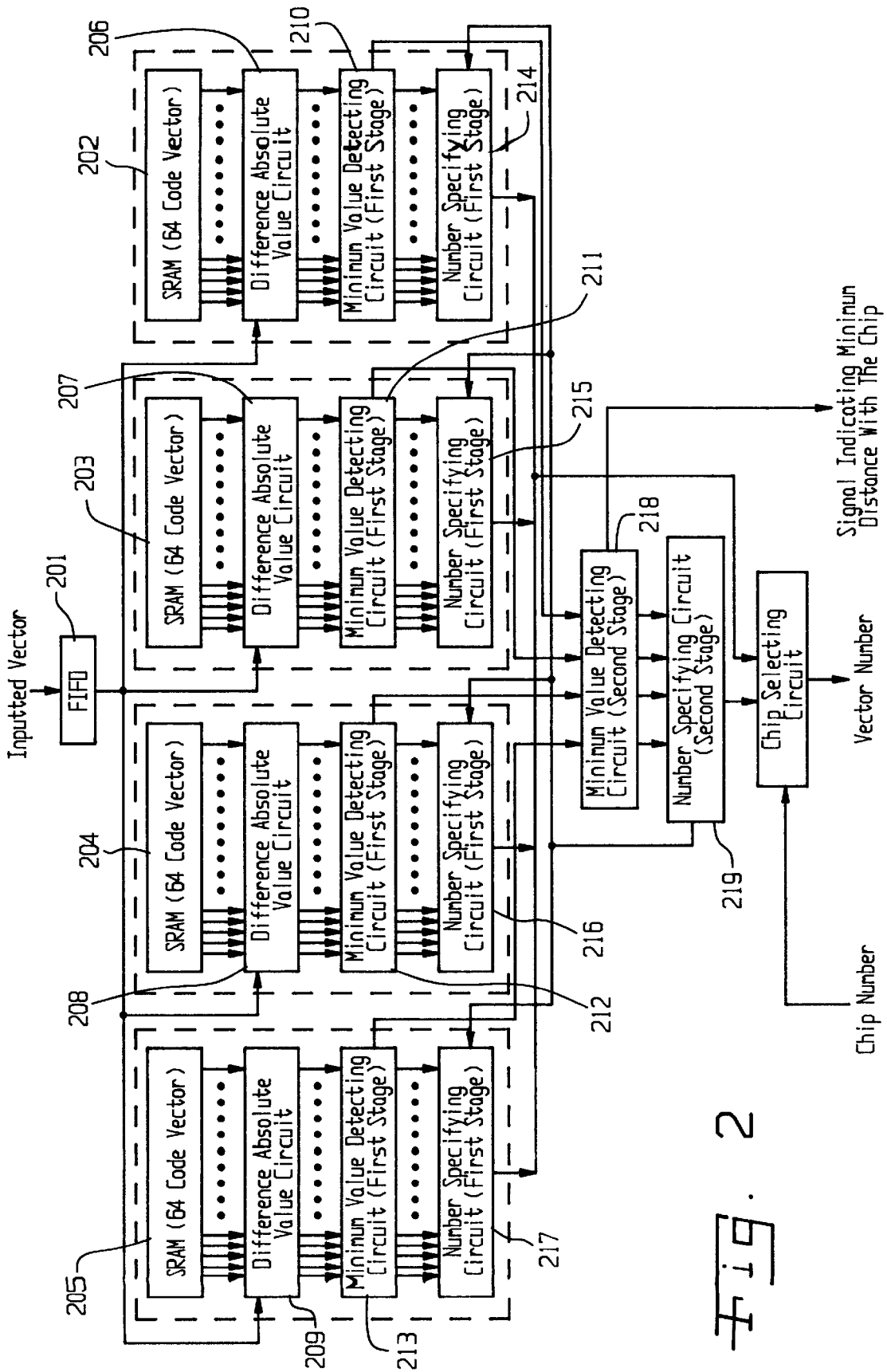
FIG. 2 is a structural diagram of a circuit block common to the master and slave chips of the vector quantization chips in the first embodiment.
Figure 3:
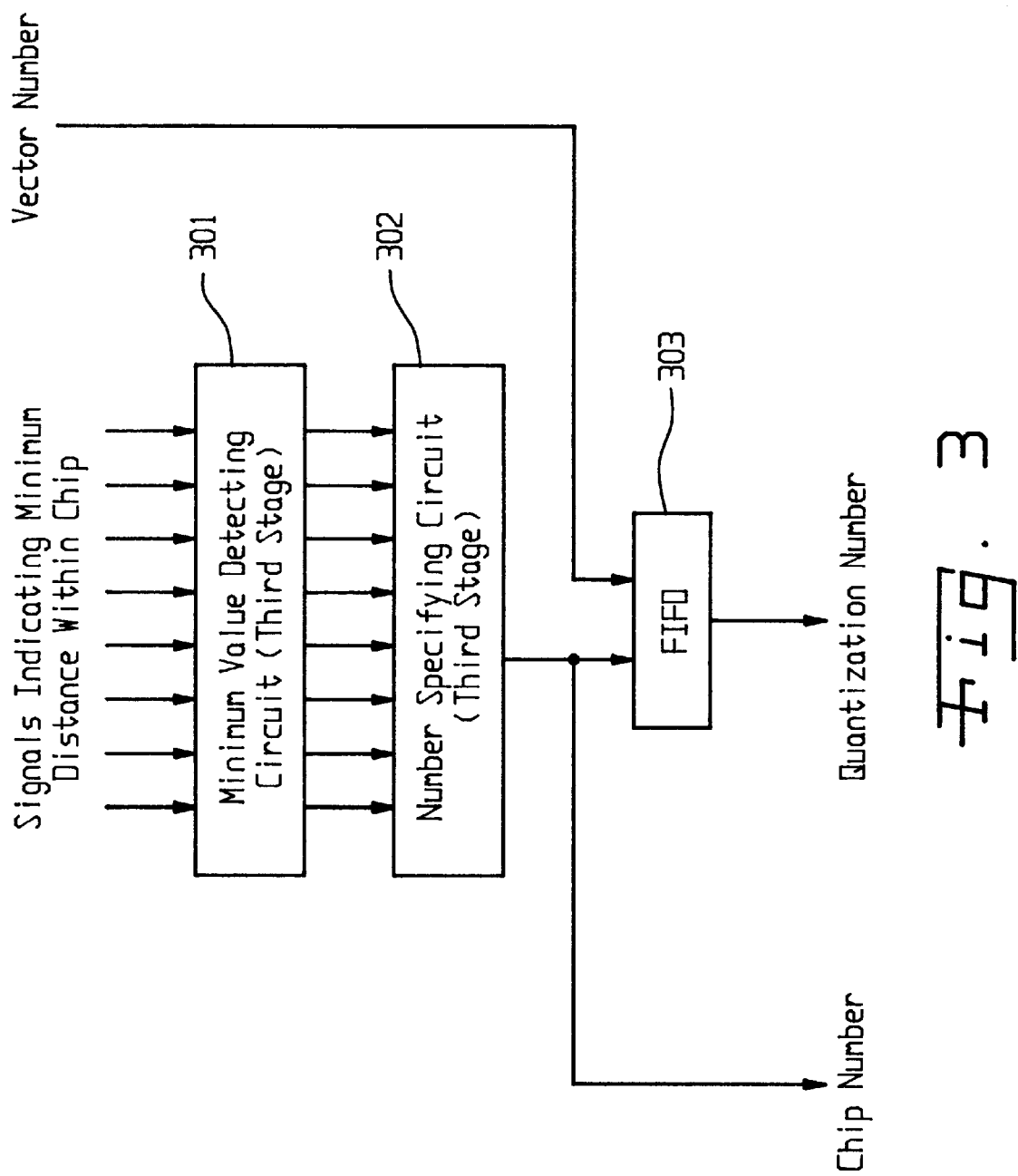
FIG. 3 is a structural diagram of a circuit block which is functional only in the master chip of the vector quantization chip in the first embodiment.

The internal circuit blocks of the VQ chips are shown in FIGS. 2 and 3. FIG. 2 shows the circuitry which is effective in both the master chip and the slave chips, while FIG. 3 shows circuitry employed only in the master chip. The circuit blocks shown in FIGS. 2 and 3 are installed in both the master chip and the slave chips in the present embodiment; however, it is of course the case that the circuitry of FIG. 3 may be installed only in the master chip, or the circuitry of FIG. 3 may be produced in another chip. The essential properties of the present invention are present in the circuit structure shown in FIGS. 1 through 3; the function and operation of these circuits will be explained in detail hereinbelow.

In FIG. 2, reference 201 indicates a FIFO buffer which stores the input vectors. This FIFO buffer accepts input vectors by 32 bits, and is capable of storing a maximum of 64 vectors. Here, the number of bits is not particularly limited to 32 bits, and the number of vectors is not particularly limited to 64; these numbers may be larger or smaller. A terminals is used in the FIFO buffer which outputs the input vectors one element at a time.

References 202 through 205 indicate SR.AMs having a memory capacity of 8 kbit; these are capable of storing, respectively, 64 code vectors. Each code vector is inputted from the exterior and written in in advance in accordance with the predetermined operation. Here, SRAM was employed; however, memory circuits such as DRAM, EPROM, EEPROM and the like, which are capable of being electrically written at least once, may be employed, and it is of course the case that it is possible to employ memory circuits into which predetermined code vectors have been written in advance during the pattern formation of semiconductor integrated circuit manufacturing processes, and which cannot be rewritten electrically. Furthermore, it is of course the case that the number of vectors which may be stored can be freely altered in accordance with the design. Output terminals are employed so that the 64 code vectors may simultaneously be read out of the SRAM in a parallel manner one element at a time.

References 206 through 209 indicate circuits which calculate the absolute value of the difference between code vectors outputted by SRAM 202 through 205 and input vectors outputted from FIFO (201) (hereinbelow, these circuits are referred to as difference absolute value circuits); these have a structure such that a number of blocks having the circuit structure shown in FIG. 4 which is equal to the number of code vectors stored in the SRAM are disposed in parallel.

Reference 401 indicates a circuit which conducts the addition of the values inputted, one element at a time, from the FIFO and the SRAM. The input from the FIFO is subjected to two complementary operations in advance prior to being inputted into the adder. After this, by means of the addition, a difference operation is conducted with respect to both inputs In the present embodiment, a 1 bit carry signal and an 8 bit addition result are outputted from adder circuit 401. This bit number 8 is a value equal to the number of bits in one element of the vectors employed; it is of course the case that where a differing vector structure is employed, this value may be different. In the present embodiment, a ripple carry method adder, which is the most commonly known type of adder circuit, was employed; however, it is of course the case that the same functions may be realized using an adder circuit having a carry anticipation circuit or other such circuits.

Figure 4:
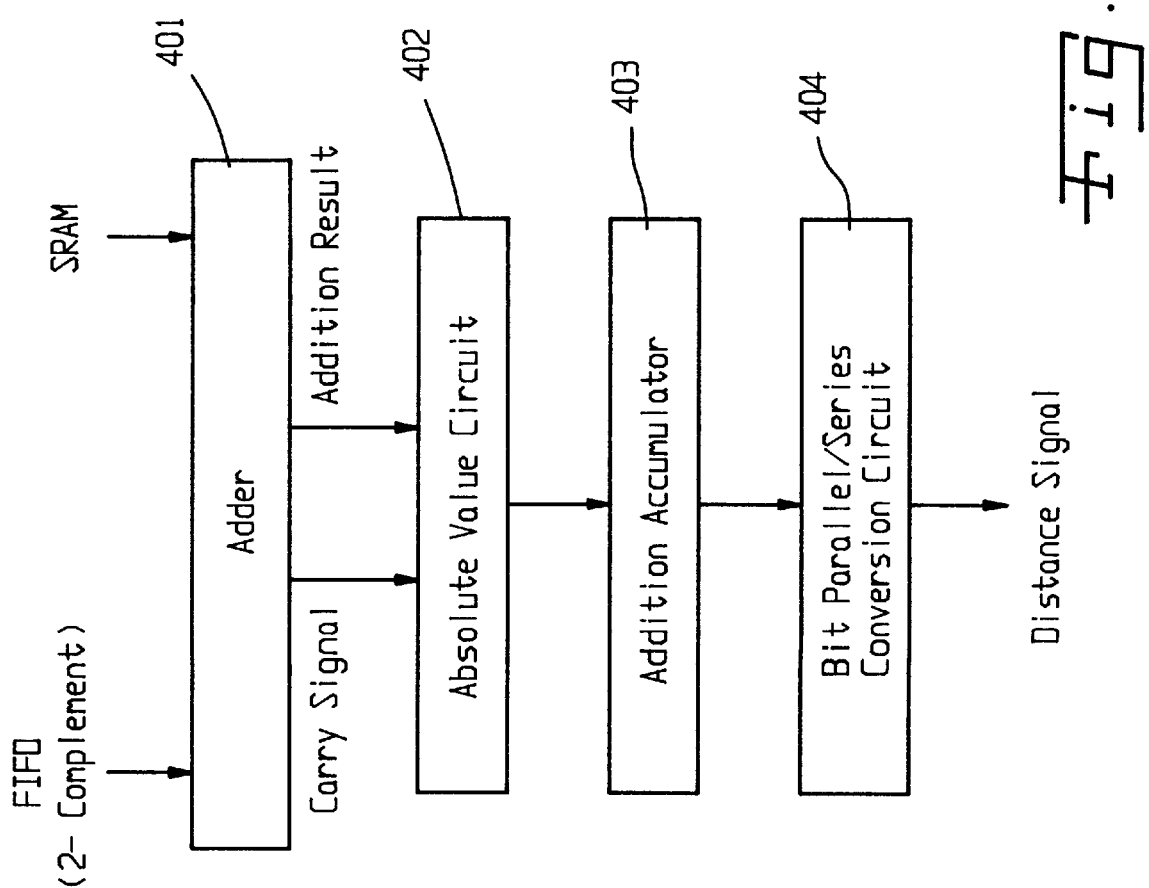
FIG. 4 is a structural diagram of a difference absolute value circuit in the first embodiment.

Reference 402 indicates an absolute value circuit; this circuit makes a determination as to the sign of the output from adder circuit 401 using the carry signal thereof, and converts the results of the addition in accordance with the table which is shown in FIG. 4. That is to say, when the carry signal has a value of 0, the results of the addition are outputted in an unchanged manner, while when the carry signal has a value of 1, the two complements of the addition results are outputted. By means of this, the absolute value of the difference between each element of the inputted vector is calculated.

Reference 403 indicates a circuit capable of adding and accumulating binary numbers to a maximum of 12 bits. The output of the absolute value circuit 403 is added to the extent of 16 elements by means of a 16 cycle repetition of operations. By means of this, it is possible to determine the difference absolute value distance. The number of bits of the addition accumulation circuit is determined by the size of the vectors employed; here, the value is 12 bits, so that the maximum value of the sum of the absolute values between each element of the 8 bit 16 element input vector and code vectors will be FFO in hexadecimal notation. Accordingly, where the vector structure is different, it is of course necessary to employ a number of addition accumulating circuits equal to the bit number derived in a similar manner.

Reference 404 indicates a circuit which conducts the conversion of the bit parallel signal so as to be outputted one bit at a time from the most significant bit; the output thereof is inputted into one of the minimum value detecting circuit blocks (210–213) in FIG. 2.

Figure 5:
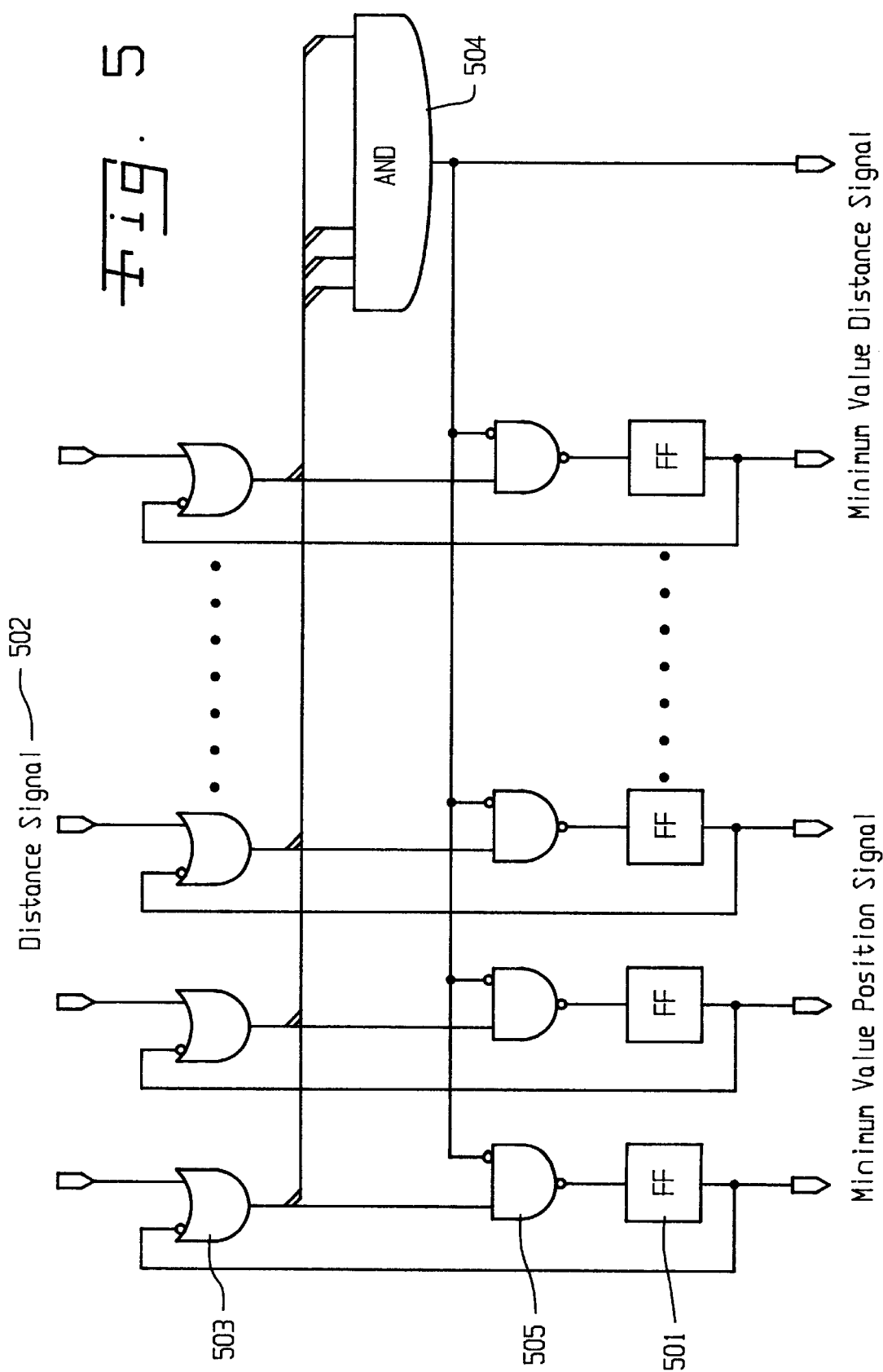
FIG. 5 is a structural diagram of a minimum value detecting circuit in the first embodiment.

Next, an explanation will be given of the circuit blocks 210 through 213 of FIG. 2. Circuits 210 through 213 detect the minimum value of the difference absolute value distance between an inputted vector and each code vector calculated by difference absolute value circuits 206 through 209; the logic circuit diagram thereof is shown in FIG. 5.

Reference 501 indicates a register which stores the state of each distance signal 502; a number of such circuits which is equal to the number of distance signals inputted is prepared, and these circuits have a function such that once a value of 0 is inputted, the output of the circuit remains 0 no matter what type of signal is inputted. Such a function can be easily realized using commonly known circuits such as JK flip flops or SR flip flops. Prior to determining the minimum value, the output of all registers is initialized to a value of 1. After this, each distance signal is inputted, one bit at a time from the most significant bit, at intervals of one cycle.

Each distance signal is first inputted into a logic gate 503. Logic gate 503 has a function such that when the output from register 501 has a value of 1, the inputted distance signal is outputted in an unchanged manner, while when the output from 501 has a value of 0, the gate outputs a value of 1. Accordingly, in the initial operation cycle, since the output of all registers 501 is 1, all distance signals are outputted in an unchanged manner. Each signal outputted from logic gates 503 is inputted into AND gate 504 and logic gate 505. AND gate 504 conducts an AND operation with respect to the output from all logic gates 503, and has the function of determining the minimum value among these outputs. The outputs of logic gates 503 and AND gate 504 is inputted into logic gates 505, which have the function of outputting a value of 1 only when the inputted values are equal. Accordingly, a value of 1 is outputted only when the inputted distance signal has a minimum value. The output of a logic gate 505 into which a distance signal which does not have the minimum value is inputted has a value of 0, and the output of 501 will be 0. From the next cycle, the distance signals for which register 501 has a value of 0 are converted to a value of 1 by logic gates 503 and these are effectively excluded from the minimum value operation at AND gate 504, while the detection of minimum values is conducted only among those distance signals for which the register 501 showed a value of 1. Accordingly, this operation is repeated for a number of times equal to the number bits in the distance signal, that is to say, for 12 cycles in the present embodiment, and by learning the position of the register 501 which maintains a value of 1 until the end, it is possible to ascertain which code vector output corresponds to the minimum value of the inputted distance signal. Furthermore, at each cycle, the minimum value of the distance sianal inputted from the output of the AND gate 504 is outputted in a 12 bit manner in order from the most significant bit.

Figure 6:
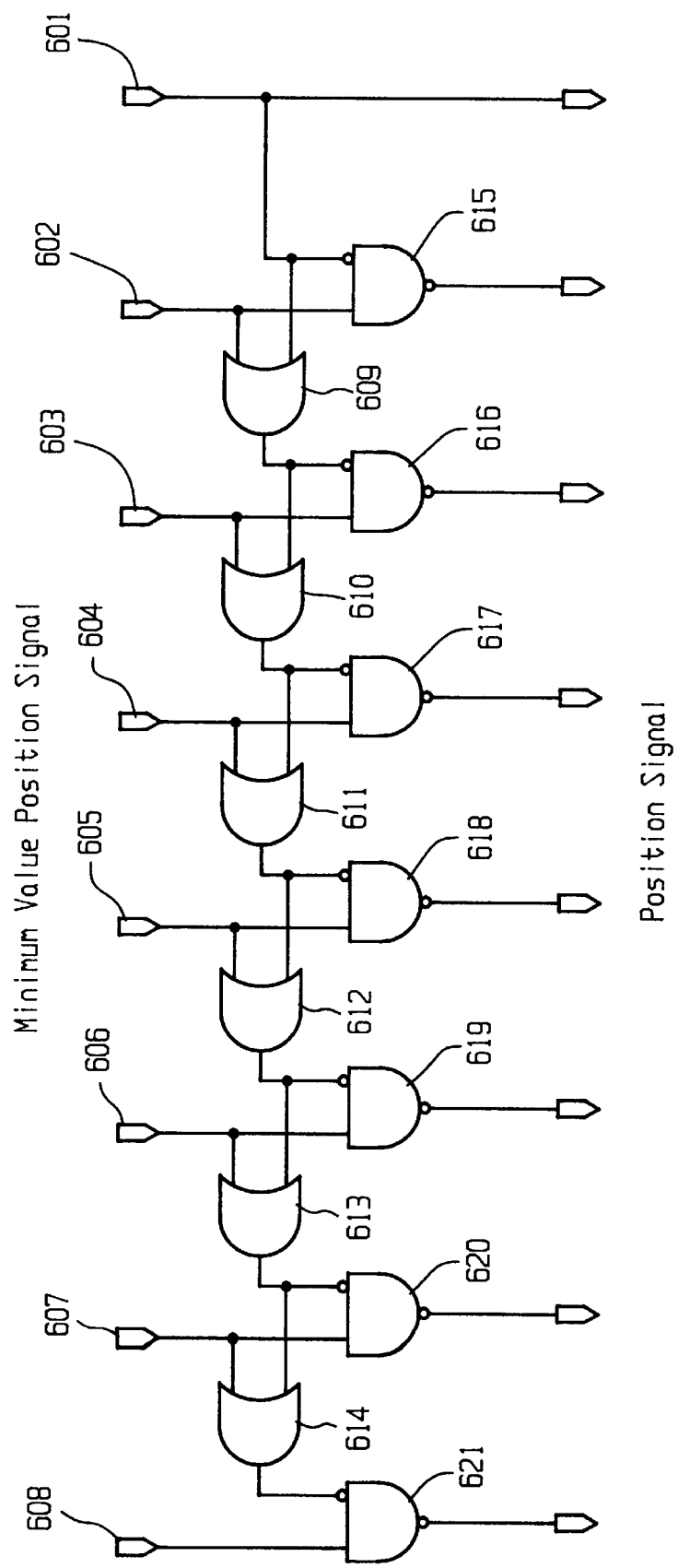
FIG. 6 is a structural example of a eight input circuit which determines only one signal when there are a plurality of minimum value position signals which explains the number specifying circuits in the first embodiment.
Figure 7:
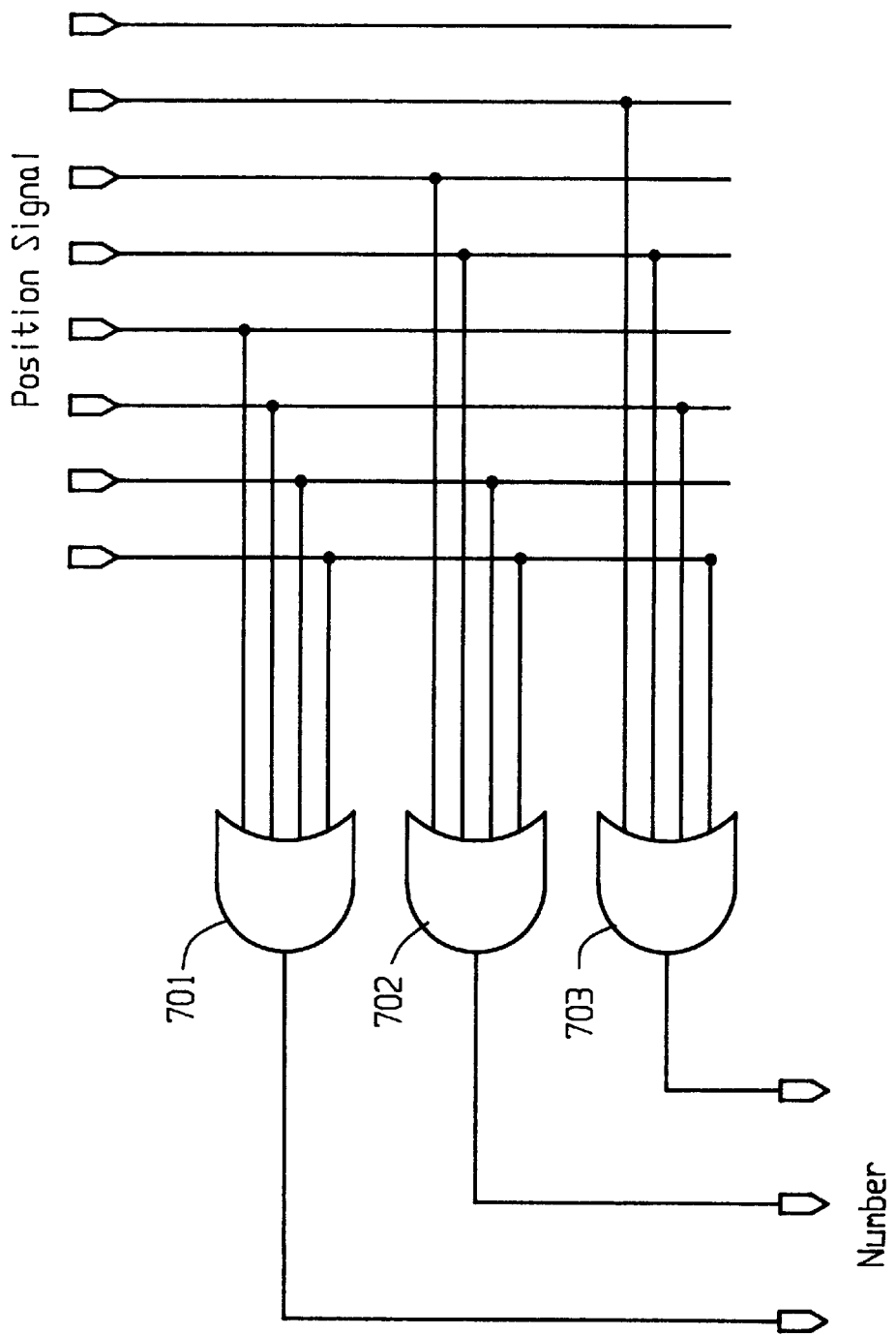
FIG. 7 is a structural example of an eight input number output circuit which explains the number specifying circuit in the first embodiment.

The output of registers 501 is inputted into the number specifying circuit shown by references 214 through 217 of FIG. 2. An example of the circuitry of this number specifying circuit, in which there are 8 inputs, is shown in FIGS. 6 and 7. FIG. 6 indicates circuitry for deciding on a single signal when a plurality of minimum distance position sianals are present. References 601 through 608 indicate input terminals for the minimum value position signals, while references 609 through 614 indicate two-input OR gates. These OR gates 609 through 614 have a structure such as to obtain a logical sum while assembling the signals from terminals 601 through 607 in order; the outputs thereof are inputted into logical gates 616 through 621 together with signals inputted into terminals 602 through 608. Signals from terminals 601 and 602 are inputted into logic gate 615. Logic gates 615 through 621 have a function such that when a value of 1 is inputted into the right hand input terminal, the gates output a value of 0. Accordingly, among the inputted signals having a value of 1 and 0, only those values of 1 present on the extreme right hand side appear in the output terminals as position signals, while all other signals are converted to a value of 0. This function is absolutely necessary in order to conduct the subsequent minimum value number specification; however, the order of precedence, which has a value of 1, is not limited to this example, and may be freely determined by altering the connections.

In FIG. 6, after the signals have been converted, the oiutput thereof is inputted into the circuitry of FIG. 7, and the numbers are outputted. References 701 through 703 indicate four-input OR gates; as is clear from the connections shown in the figure, the structure is one in which the numbers are applied in order from the right side of the inputted position. Of course, these connections may also be freely connected to allocate the numbers. Using the principle described above, it is possible to output the number of the minimum value position.

As shown in FIG. 2, in the VQ chips of the present example, four circuit blocks which determine the number of the code vector having the closest difference absolute value distance are provided for each 64 code vectors, and the operation is executed completely in parallel. The minimum value distances of each block, which comprise the results of the various operations, are inputted in an unchanged manner into the minimum value detecting circuit 218, and together with the number specifying circuit 219, this specifies in which block the code vector which is closest to the input vector is present, by means of the same principle as that given above. Furthermore, the output of the minimum value detecting circuit 218 of each VQ chip 101 through 108 is outputted as the minimum distance signal within the chip, and in FIG. 1, this passes through chip exterior wiring 111 through 118 and is inputted into VQ chip (master chip) 101.

The minimum distance signal within the chip from each VQ chip inputted into VQ chip 101 is inputted into the minimum value detecting circuit 301 of FIG. 3, and this, together with the number specifying circuit 302, specifies in which chip the code vector closest to the inputted vector is present, by means of the same principle given above. By means of this, the chip number is outputted from the number specifying circuit 302.

The chip number which was determined is then transmitted from VQ chip 101 to each of the VQ chips via wiring 119 shown in FIG. 1. Vector numbers from the VQ chip to which the received chip number was allocated are transmitted to VQ chip 101 via wiring 120. In VQ chip 101, the stored chip number and the received vector number are stored together in the FIFO buffer 303 in FIG. 3 as a quantization number. By outputting the value stored in FIFO buffer 303, it is possible to ascertain the quantization number from the exterior.

Figure 8:
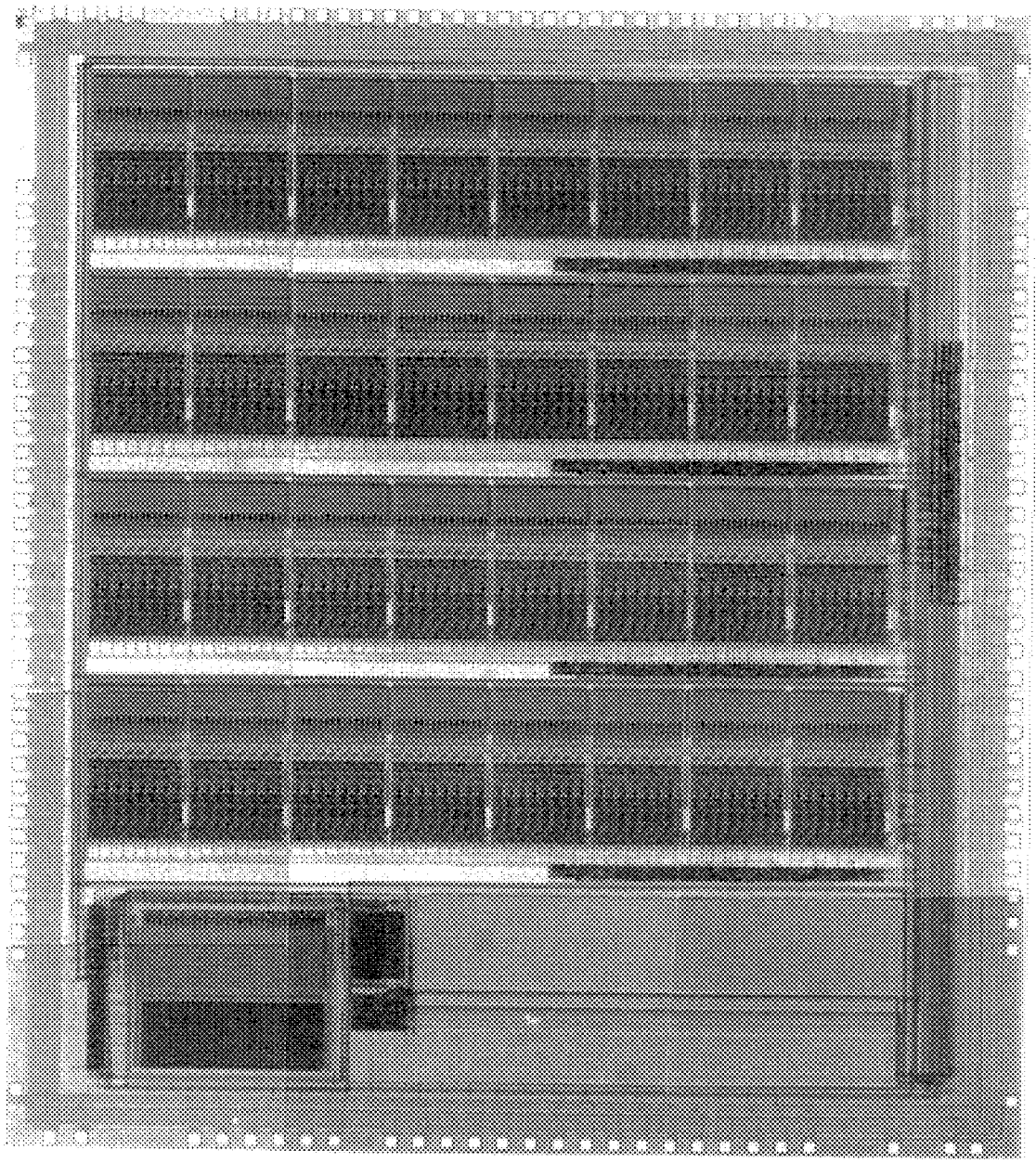
FIG. 8 is a photograph of the minute pattern formed on the substrate of a VQ chip, which is capable of storina 256 code vectors, produced in accordance with the first embodiment.

FIG. 8 is a photograph of the VQ chip produced. Functions corresponding to 256 code vectors are integrated irn a rectangle of 7.98 mm×9.03 mm.

FIG. 9 is a compilation of the method of the VQ chip produced. This method is, however, only indicated as one possible example; the present invention is not particularly limited to this method.

By utilizing a minimum value detecting circuits in a structure having a number of stages in this manner, it is possible to conduct vector quantization with respect to a number of code vectors, 2,048, which is extremely large in comparison to that conventionally possible. By utilizing the same sort of multi-stage structure, it is in essence possible to increase without limit the number of code vectors. When this is done, if one type of chip containing circuit blocks which conduct distance calculations and which has the function shown in FIG. 2 is produced in advance, then it is possible to connect a limitless number of chips and to conduct vector quantization by separately providing chips having the function shown in FIG. 3. This not only has the advantage of promoting the widespread use of vector quantization chips, but also makes possible the construction of low cost systems. Furthermore, the fact that all code vectors can be divided by block using a comparatively small number of code vectors facilitates chip design in that when the actual layout design of the semiconductor integrated circuit is conducted, it is possible to reduce lags in the transmission timing of distance data resulting from wiring delay. This also greatly contributes to a decrease in system production costs. Furthermore, the execution of all operations in parallel allows for an enormous increase in vector quantization operational speed in comparison with vector quanLizaLion conducted by conventional CISC processors, and real time moving image compression is greatly facilitated; the effects of this are incalculable.

(Embodiment 2)

Figure 10:
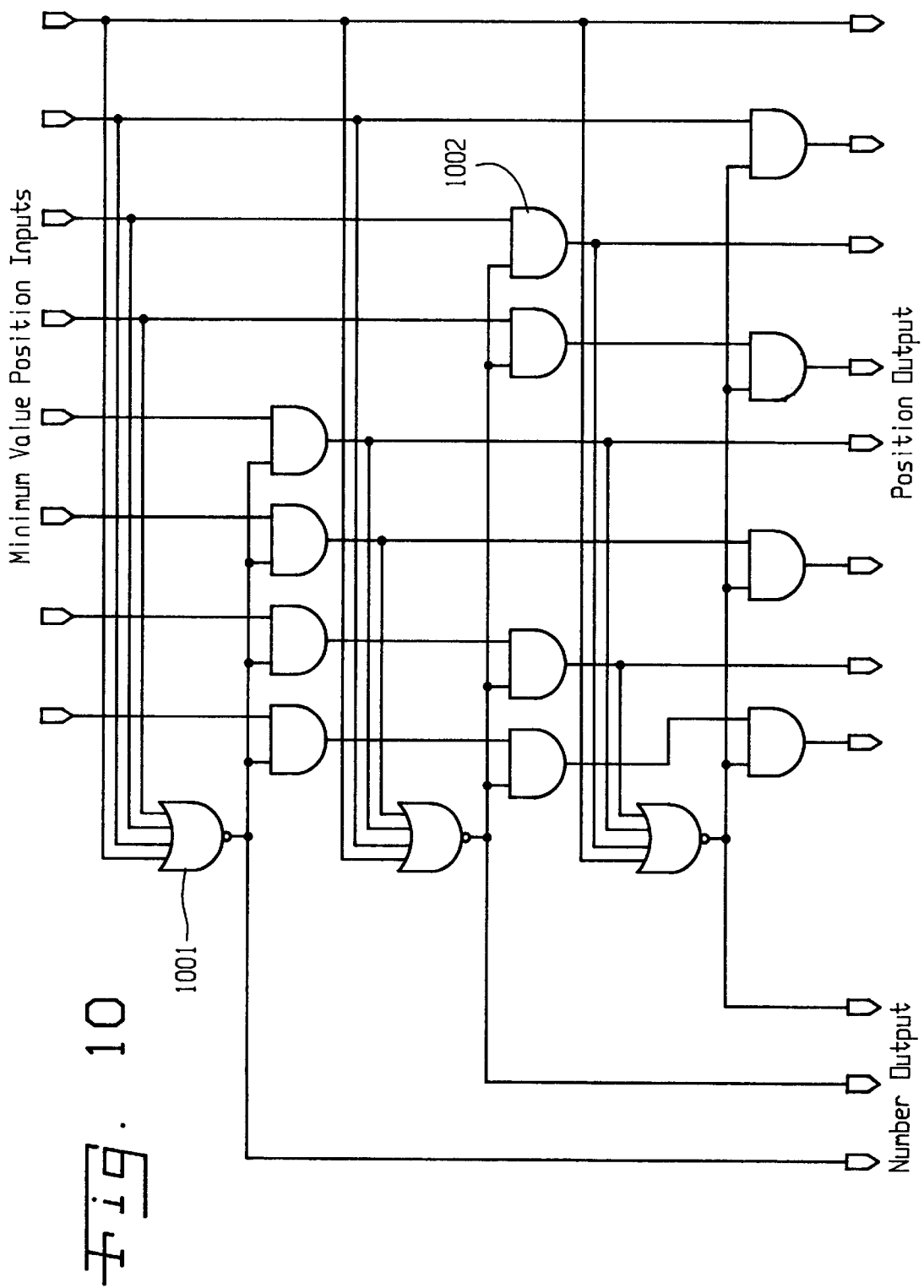
FIG. 10 is a structural example of an eight input number specifying circuit in accordance with the second embodiment.

The second embodiment of the present invention is shown in FIG. 10. The present example is employed in a number specifying circuit which realizes a function of selecting only one minimum distance position signal and a function of outputting a number using the same circuitry. This example is completely identical with that of embodiment 1 with respect to all other details. FIG. 10 shows an example utilizing eight inputs in order to explain in a simple manner the principle of this embodiment. The number specification circuit of the present embodiment is constructed in a simple manner like that of embodiment 1 using a simple logic gate comprising a NOR gate 1001 and an AND gate 1002. Furthermore, this function of this circuit is completely identical to that of the number specifying circuit structured as shown in FIGS. 6 and 7; the value of 1 inputted in the rightmost position is selected and the number thereof is outputted. However, when the number of input signals n increases, the maximum number of gates which must be passed through before the output changes as a result of the inputted signal increases proportionately to n using two-input gate conversion in the case of the structure of embodiment 1, while this increases in proportion to log n in the present embodiment. For example, in the case of 64 inputs, the number of gate stages is 67 in the case of the circuit structure of embodiment 1, while 36 stages are required in the circuitry of the present embodiment. That is to say, when a structure is employed having a large number of inputs such as 64 or the like, it can be seen that the gate delay time in the calculations is shorter in the case of the present embodiment. Accordingly, such circuitry is highly appropriate in order to conduct vector quantization at a higher speed.

(Embodiment 3)

Figure 11:
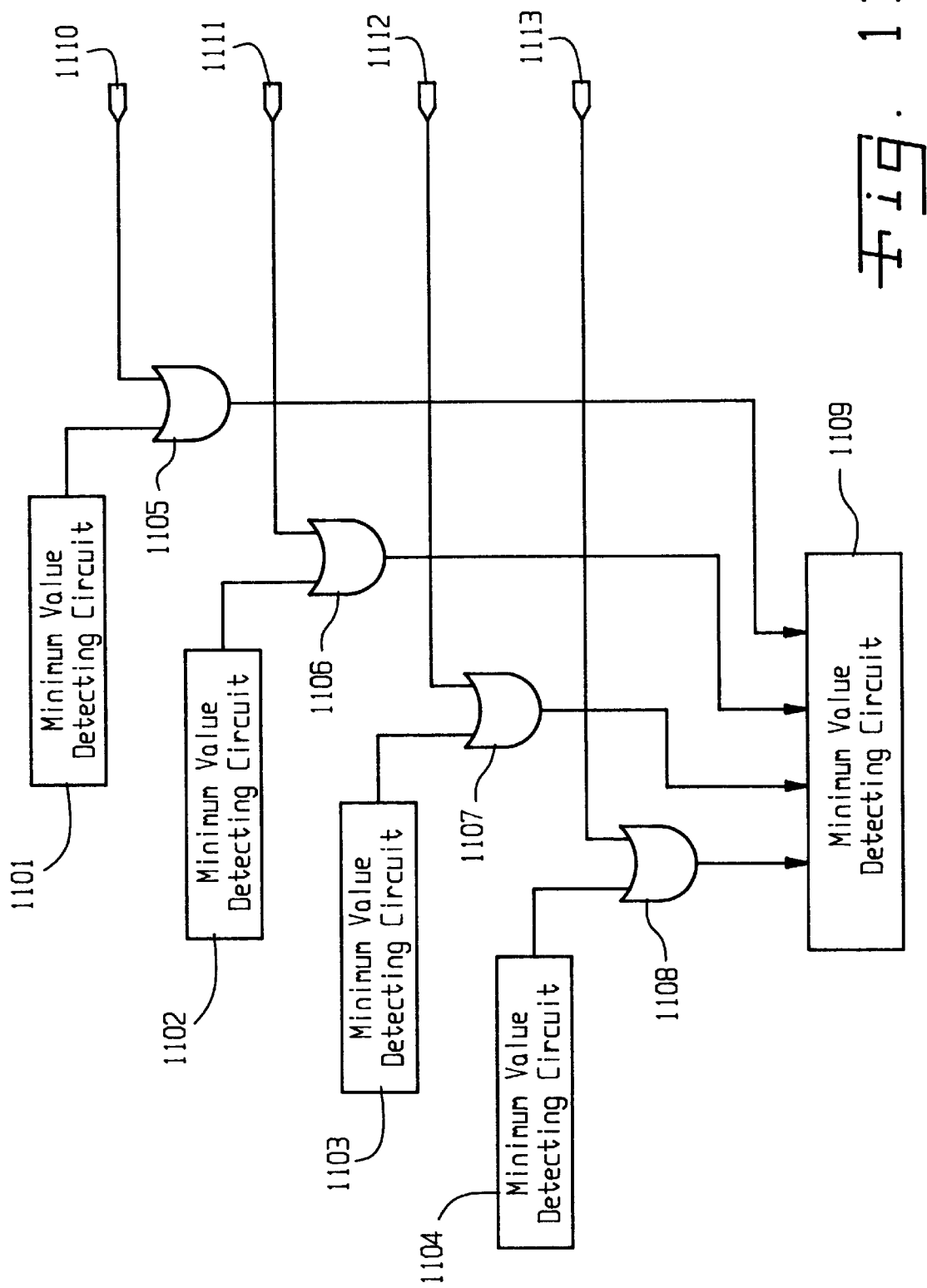
FIG. 11 is a diagram explaining the block selection function in the third embodiment.

FIG. 11 shows a third embodiment of the presenz invention. In this embodiment, electrical control is exerted over the number of code vectors made possible in the case in which vector quantization is conducted using the minimum value detecting circuit of FIG. 5 which is used in the first embodiment. This embodiment is exactly identical to the other embodiments with respect to other parts. References 1101 through 1104 indicate minimum value detecting circuits which are arranged in stages. The minimum value distance signals which are the outputs of these circuits are connected with the following stage minimum value detecting circuit 1109 via OR gates 1105 through 1108. The control signals (block selecting signals) 1101 through 1113 are inputted into OR gates 1105 through 1108, and when a block selecting signal has a value of 1, the output will always have a value of 1. Accordingly, the distance output of minimum value detecting circuits 1101 through 1104 for which the block selecting signal has a value of 1 have a certain value in actuality; however, these are converted to the value with the greatest distance, and in effect, all code vectors connected upstream may be ignored. That is to say, if the maximum number of code vectors required in the hardware according to the method of embodiment 1 are guaranteed, then using this method, it is possible to easily control the number of code vectors which are actually employed using electrical signals. This has become possible for the first time because the minimum value detecting circuits are arranged in a multi-stage structure and the distance data are transmitted; this is one of the most important features of the present invention. This invention is thus extremely useful when vector quantization is applied to the real time data compression of moving images, and using the maximum number of code vectors possible given the capacity of the communication circuits employed, moving images having the best possible picture quality are transmitted using the optimal compression ratio.

Here, the example which was shown involved a portion constructed using four input minimum value detecting circuits; however, it is of course the case that the same method may be applied even with different numbers of inputs. Furthermore, OR gates were used in the present embodiment to control the distance signals; however, it is of course the case that any logical circuits may be employed insofar as they have an equivalent function.

(Embodiment 4)

Figure 12:
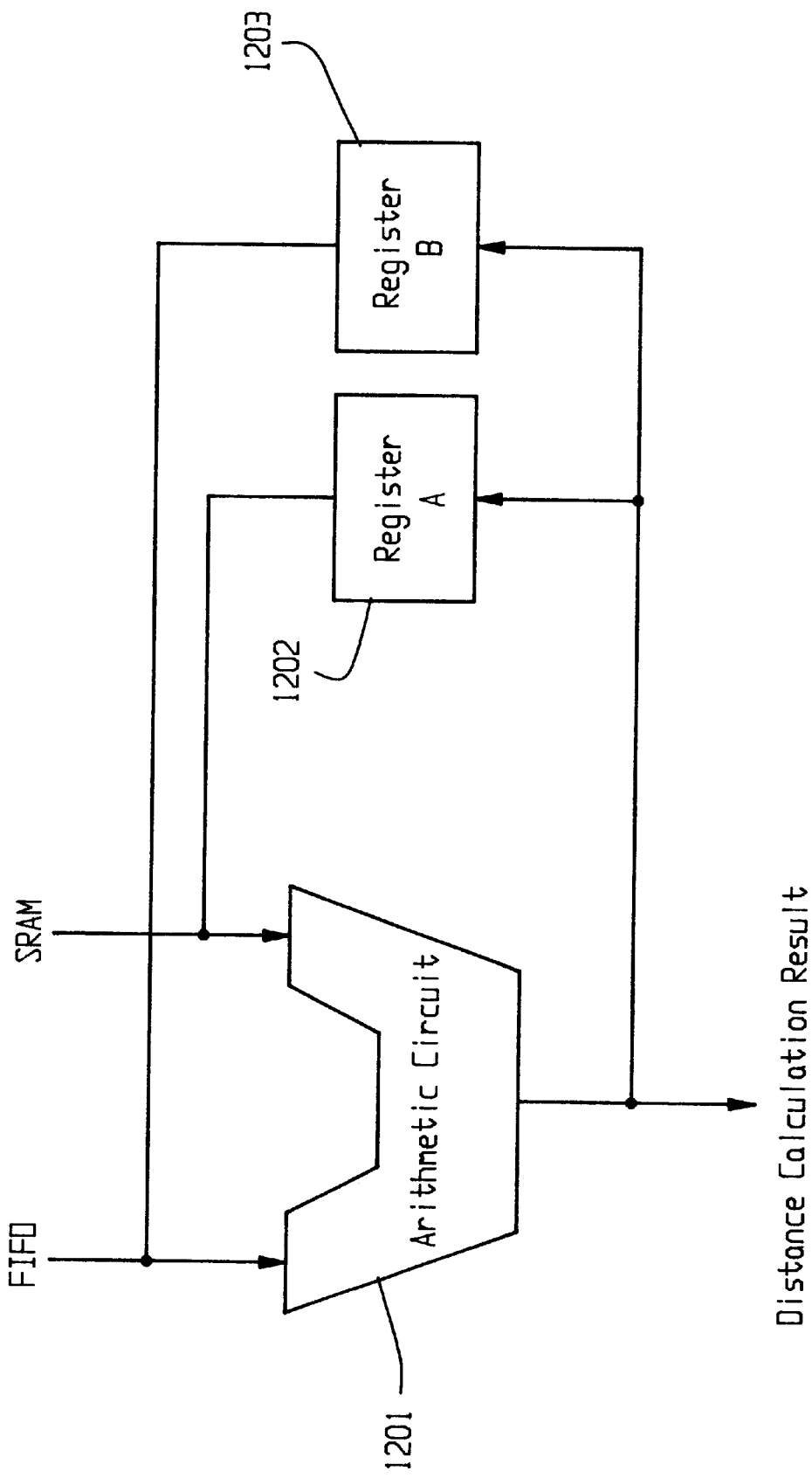
FIG. 12 is a structural diagram of a Euclidean distance circuit in the fourth embodiment.
Figure 13:
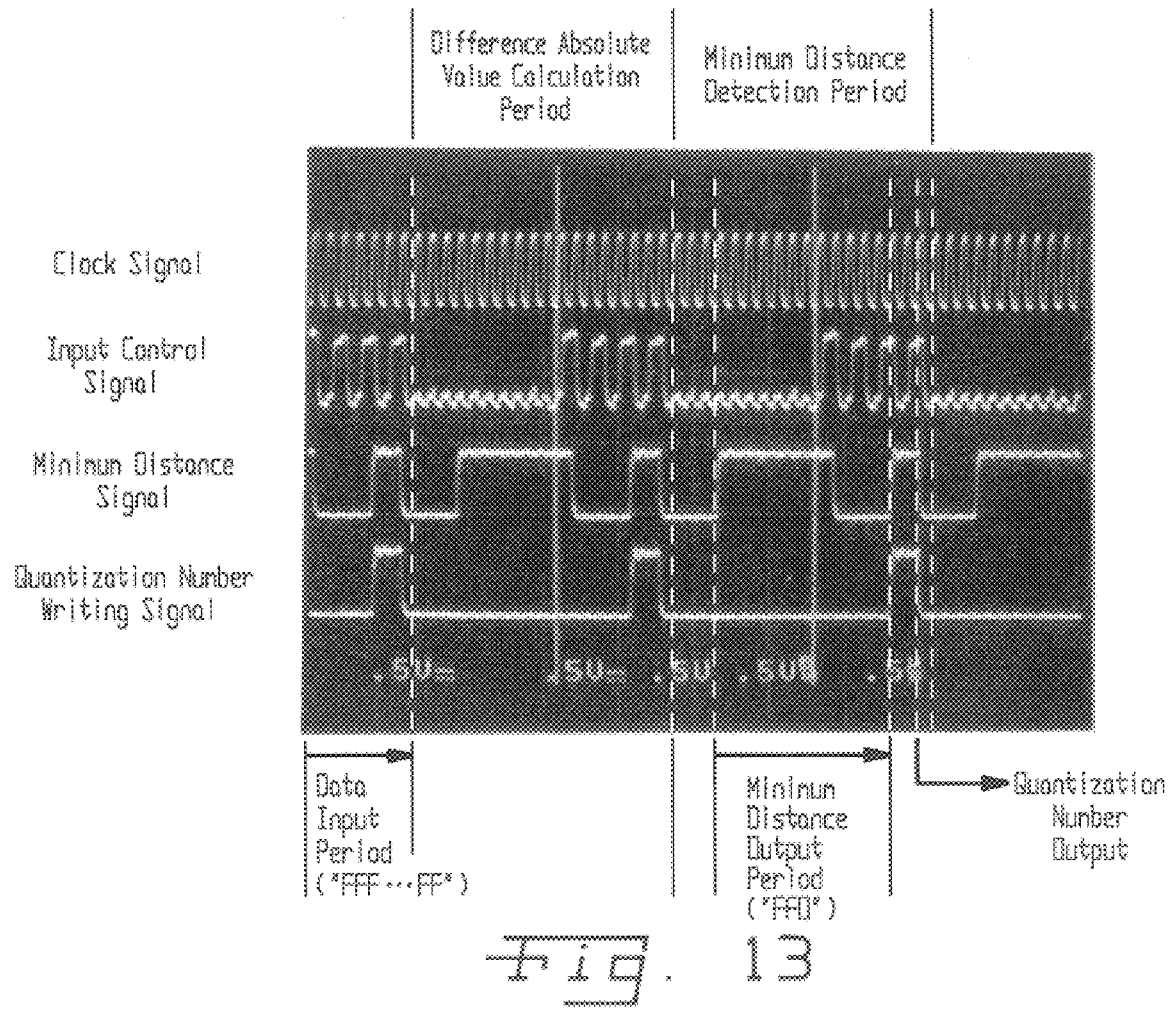
FIG. 13 is a photograph of an oscilloscopic waveform showing the results of an observation of the signal wave forms in the fifth embodiment.

FIG. 12 shows a fourth embodiment of the present invention. In embodiment 1, an example was shown which employed the difference absolute value circuits depicted in FIG. 4; however, in the present embodiment, the present invention is applied in the case in which, in place of this, the arithmetic circuit 1201, which is capable of executing a plurality of calculations, and the registers 1202 and 1203, all of which are depicted in FIG. 13, are employed, the Euclidean distance is calculated, and this is employed as the distance between vectors. This embodiment is identical to the other embodiments with respect to the other details thereof. A circuit which is capable of subtraction and multiplication is employed as the arithmetic circuit, and the result of the calculations are obtained by conducting calculations for a plurality of cycles using registers 1202 and 1203. It is possible to calculate the distance between an inputted vector and each code vector by providing only the necessary amount of such circuits in a parallel format.

The present invention may be applied even to the case in which this type of Euclidean distance is used to express the degree of similarity between vectors, using the same structure as in the other embodiments in the processing of minimum distance detection or number specification. Since multiplication requires large scale circuitry in general, when Fuclidean distance is used, a large scale increase in the circuit surface is produced in comparison with the case in which difference absolute value distance is employed. Accordingly, the number of code vectors which may be stored in one VQ chip is of course greatly reduced in comparison with the case in which difference absolute values are used as the distances. However, if a method of multi-stage connected operations is employed in which the minimum value detection circuitry extends between chips, then it is a simple matter to guarantee the desired number of code vectors in the system as a whole.

(Embodiment 5)

FIG. 13 shows a fifth embodiment of the present invention. The present embodiment results from operating the vector quantization system explained in embodiment 1 so that the difference absolute value operation cycle and the minimum value detection cycle are independent, and observing the main signal at intervals of 18 cycles when vector quantization is conducted. In this example, the timing relationship is shown between the clock signal, the input control signal, the distance output from the three stage minimum value detection circuit, and the quantization code writing control signal into the output FIFO buffer, when a value of, in hexadecimal vector display, (00, 00, 00, 00, 00, 00, 00, 00, 00, 00, 00, 00, 00, 00, 00, 00), is written as an identical value inputted into all code vectors within the VQ chip, and a value of (FF, FF, FF, FF, FF, FF, FF, FF, FF, FF, FF, FF, FF, FF, FF, FF) is inputted as the input vector. Once the input vector has been inputted into the input FIFO divided into 4 by 32 bits for 8 clock cycles, the VQ operation is initiated. After 18 cycles of difference absolute value operations, the distance signal is transmitted to the first stage minimum value detecting circuit divided into 12 cycles in order from the most significant bit thereof, and after a delay of one cycle, the minimum distance signal within the block is transmitted to the second stage minimum value detecting circuit, and after a further one cycle delay, the minimum distance signal within the chip is transmitted to the third stage minimum value detecting circuit. Accordingly, the observed minimum distance signal is outputted at the 22nd cycle from the termination of input vector transmission. The value of the minimum value signal is reliably FF0 in hexadecimal notation, so that results show that calculations have been reliably executed. Operations with respect to the subsequent input vector are executed at intervals of 18 cycles, and it is possible to confirm that the same wave form is outputted at intervals of 18 cycles in the minimum value signal.

In the present embodiment, because the difference absolute value calculation and minimum distance detection calculation are independently conducted, it is possible to continuously execute the two operations with respect to differing input vectors. The 18 cycles in the present embodiment are only two cycles greater than the 16 elements of the vectors. This is because the difference absolute value operation is the most time-consuming with respect to vectors of this size, requiring a number of cycles at least equal to the 16 elements, while the remaining 2 cycles are necessary for use in data transfer from memories and the like. However, in accordance with this method, operations can be continuously conducted without waiting for all of the processing as in the first embodiment, so that it is possible to increase the throughput of the quantization and to conduct operations at a higher speed; it is possible to execute quantization operations at intervals of 540 nsec at 33 MHz. This speed is sufficient to execute real time compression of moving images.

What is claimed is:

1. An assembly, comprising:
   a codebook including a plurality of codebook vectors, each codebook vector having a respective identification code associated therewith;
   a first circuit arranged to determine a distance value between an input vector and each respective one of said plurality of codebook vectors and to provide a respective distance signal representative thereof;
   a second circuit, responsive to said distance signals provided by said first circuit, for determining the smallest distance value and identifying the codebook vector associated therewith; and
   a third circuit arranged to provide the identification code associated with the codebook vector identified by said second circuit in connection with the smallest distance value determination;
   said second circuit further comprising a plurality of logic circuits arranged in a cascade configuration, each logic circuit having an input side and an output side and respectively including at least one logic device, the output side of one logic circuit being coupled to the input side of a next logic circuit in said cascade configuration;
   each respective logic circuit being responsive to a respective plurality of said distance signals provided at its input side for determining the smallest distance value and providing the smallest distance value distance signal at its output side.

2. The assembly as recited in claim 1, wherein each respective logic circuit further comprises:

a plurality of first logic OR gates each having a non-inverting input operatively receiving a respective distance signal, an inverting input, and an output;
   a plurality of first logic NAND gates each having a non-inverting input connected to the output of a respectively associated first logic OR gate, an inverting input, and an output coupled to the inverting input of said associated first logic OR gate; and
   a logic AND gate having a plurality of inputs each coupled to the output of a respective first logic OR gate, and an output connected in common to the inverting input of each respective one of said plurality of first logic NAND gates.

3. The assembly as recited in claim 2, wherein each distance signal being provided in a digital format.

4. The assembly as recited in claim 3, wherein each logic circuit being operative over a plurality of successive processing cycles equal in number to the bit length of said distance signals, said plurality of processing cycles being associated with a corresponding plurality of bit shifting cycles in which each distance signal provided as an input signal into said logic circuit being inputted into a respective first logic OR gate in order from the most significant bit to the least significant bit at intervals of one bit per cycle.

5. The assembly as recited in claim 1, wherein each respective logic circuit further comprises:
   a blocking circuit, responsive to the smallest value distance signal provided at the output of said respective logic circuit, for selectably transmitting the smallest value distance signal to a next logic circuit in said cascade configuration or forcing the output of said respective logic circuit to a predetermined value, in accordance with a control input.

6. The assembly as recited in claim 5, wherein the blocking circuit of each respective one of said plurality of logic circuits further comprises:
   a logic OR gate having a signal input coupled to the output of said respective one logic circuit, a control input, and an output coupled to the input side of a next logic circuit in said cascade configuration.

7. The assembly as recited in claim 1, wherein said plurality of logic circuits being arranged further into a plurality of discrete selection circuit modules each respectively including at least one of said logic circuits.

8. The assembly as recited in claim 7, further comprises:
   a plurality of discrete semiconductor chips each including a respective one of said plurality of discrete selection circuit modules.

9. The assembly as recited in claim 8, further comprises:
   a first connection means, including electrical connections, for enabling the transmission between at least one semiconductor chip and at least another semiconductor chip of the smallest value distance signals associated therewith.

10. The assembly as recited in claim 9, wherein said third circuit further comprises:
    a plurality of code selecting circuits each respectively associated with a corresponding one of said plurality of discrete selection circuit modules;
    each respective one of said plurality of code selecting circuits being arranged to provide the identification code of the codebook vector identified by the at least one logic circuit of the associated selection circuit module in connection with the smallest distance value determination.

11. The assembly as recited in claim 10, further comprises:

a second connection means, including electrical connections, for enabling the transmission between at least one semiconductor chip and at least another semiconductor chip of the identification codes provided by the respective code selecting circuits associated with the respective selection circuit modules of said at least one semiconductor chip and said at least another semiconductor chip.

12. The assembly as recited in claim 8, wherein said third circuit further comprises:
- a plurality of code selecting circuits each respectively associated with a corresponding one of said plurality of discrete selection circuit modules;
- each respective one of said plurality of code selecting circuits being arranged to provide the identification code of the codebook vector identified by the at least one logic circuit of the associated selection circuit module in connection with the smallest distance value determination.

13. The assembly as recited in claim 12, further comprises:
- a connection means, including electrical connections, for enabling the transmission between at least one semiconductor chip and at least another semiconductor chip of the identification codes provided by the respective code selecting circuits associated with the respective selection circuit modules of said at least one semiconductor chip and said at least another semiconductor chip.

14. The assembly as recited in claim 13, wherein said first circuit further comprises:
- a processor, responsive to said input vector and said plurality of codebook vectors, for computing a measure of the difference absolute value distance between said input vector and each respective one of said plurality of codebook vectors;
- said processor being operative with respect to each respective one of said plurality of codebook vectors to perform a difference operation between one element of said input vector and a corresponding element of said respective one codebook vector by adding the elements after conducting a two's complement operation with respect to one of the elements, determine the sign of the addition result, generate an absolute value of the difference between the elements based upon the addition result and the sign determination, add the absolute value differential into an accumulator, and repeat the aforesaid processor operations with respect to each other element of said respective one codebook vector.

15. The assembly as recited in claim 13, further comprises:
- a controller arranged to control the operations of at least said first circuit, said second circuit, and said third circuit, said controller being operative in at least one control mode thereof to enable said second circuit to output the codebook vector associated with the smallest distance value determination within a selected time period relative to reception of said input vector.

16. The assembly as recited in claim 15, wherein the selected time period being defined in relation to the number of vector elements N of each one of said plurality of codebook vectors, wherein said second circuit outputs the codebook vector associated with the smallest distance value determination within a time period less than N number of operating cycles on each discrete semiconductor chip plus five.

17. The assembly as recited in claim 16, wherein said controller being operative to enable the operations of said first circuit and the operations of said second circuit to be executed independently of one another.

18. The assembly as recited in claim 17, wherein said controller being operative to enable the operations of said first circuit and the operations of said second circuit to be executed simultaneously with respect to different input vectors.

19. The assembly as recited in claim 18, wherein said first circuit further comprises:
- a processor, responsive to said input vector and said plurality of codebook vectors, for computing a measure of the difference absolute value distance between said input vector and each respective one of said plurality of codebook vectors;
- said processor being operative with respect to each respective one of said plurality of codebook vectors to perform a difference operation between one element of said input vector and a corresponding element of said respective one codebook vector by adding the elements after conducting a two's complement operation with respect to one of the elements, determine the sign of the addition result, generate an absolute value of the difference between the elements based upon the addition result and the sign determination, add the absolute value differential into an accumulator, and repeat the aforesaid processor operations with respect to each other element of said respective one codebook vector.

20. The assembly as recited in claim 8, further comprises:
- a controller arranged to control the operations of at least said first circuit, said second circuit, and said third circuit, said controller being operative in at least one control mode thereof to enable said second circuit to output the codebook vector associated with the smallest distance value determination within a selected time period relative to reception of said input vector.

21. The assembly as recited in claim 20, wherein the selected time period being defined in relation to the number of vector elements N of each one of said plurality of codebook vectors, wherein said second circuit outputs the codebook vector associated with the smallest distance value determination within a time period less than N number of operating cycles on each discrete semiconductor chip plus five.

22. The assembly as recited in claim 21, wherein said first circuit further comprises:
- a processor, responsive to said input vector and said plurality of codebook vectors, for computing a measure of the difference absolute value distance between said input vector and each respective one of said plurality of codebook vectors;
- said processor being operative with respect to each respective one of said plurality of codebook vectors to perform a difference operation between one element of said input vector and a corresponding element of said respective one codebook vector by adding the elements after conducting a two's complement operation with respect to one of the elements, determine the sign of the addition result, generate an absolute value of the difference between the elements based upon the addition result and the sign determination, add the absolute value differential into an accumulator, and repeat the aforesaid processor operations with respect to each other element of said respective one codebook vector.

23. The assembly as recited in claim 1, further comprises:
a controller arranged to control the operations of at least said first circuit, said second circuit, and said third circuit, said controller being operative in at least one control mode thereof to enable said second circuit to output the codebook vector associated with the smallest distance value determination within a selected time period relative to reception of said input vector.

24. The assembly as recited in claim 23, wherein said controller being operative to enable the operations of said first circuit and the operations of said second circuit to be executed independently of one another.

25. The assembly as recited in claim 24, wherein said controller being operative to enable the operations of said first circuit and the operations of said second circuit to be executed simultaneously with respect to different input vectors.

26. The assembly as recited in claim 23, wherein said plurality of logic circuits being arranged further into a plurality of discrete selection circuit modules each respectively including at least one of said logic circuits.

27. The assembly as recited in claim 26, further comprises:
a plurality of discrete semiconductor chips each including a respective one of said plurality of discrete selection circuit modules.

28. The assembly as recited in claim 27, wherein the selected time period being defined in relation to the number of vector elements N of each one of said plurality of codebook vectors, wherein said second circuit outputs the codebook vector associated with the smallest distance value determination within a time period less than N number of operating cycles on each discrete semiconductor chip plus five.

* * * * *